United States Patent [19]

Meier

[11] 4,021,646

[45] May 3, 1977

[54] UP/DOWN COUNTER WITH A TRACKING 5/6 INPUT CIRCUIT

[75] Inventor: Carl H. Meier, Davenport, Iowa

[73] Assignee: Gulf & Western Industries, Inc., New York, N.Y.

[22] Filed: Oct. 1, 1975

[21] Appl. No.: 618,489

Related U.S. Application Data

[63] Continuation-in-part of Ser. No. 478,979, June 13, 1974, Pat. No. 3,930,142.

[52] U.S. Cl. .................. 235/92 PL; 235/92 T; 235/92 EV; 235/92 R
[51] Int. Cl.² .................. H03K 21/06; G06M 3/14
[58] Field of Search ......... 235/92 PL, 92 EV, 92 T, 235/92 CC; 328/44

[56] References Cited

UNITED STATES PATENTS

| 3,549,870 | 12/1970 | Lay | 235/92 PL |
|---|---|---|---|
| 3,571,575 | 3/1971 | Barr et al. | 235/92 PL |
| 3,648,030 | 3/1972 | Shepherd et al. | 235/92 PL |

*Primary Examiner*—Joseph M. Thesz
*Attorney, Agent, or Firm*—Meyer, Tilberry & Body

[57] ABSTRACT

There is provided an improvement in a digital counting system including a digital counter which counts up when an incoming pulse is received on one terminal and counts down when an incoming pulse is received on another terminal and means for passing five of six incoming pulses to each of the terminals. This type of counting system is used in totalizing time when driven by a sixty cycle line current. The improvement is the provision of a sequence control means for both the up and down incoming pulses to inhibit one out of each six pulses at identical progressively totalized counting positions so that the up/down counter tracks identically as it is counting up and down.

1 Claim, 9 Drawing Figures

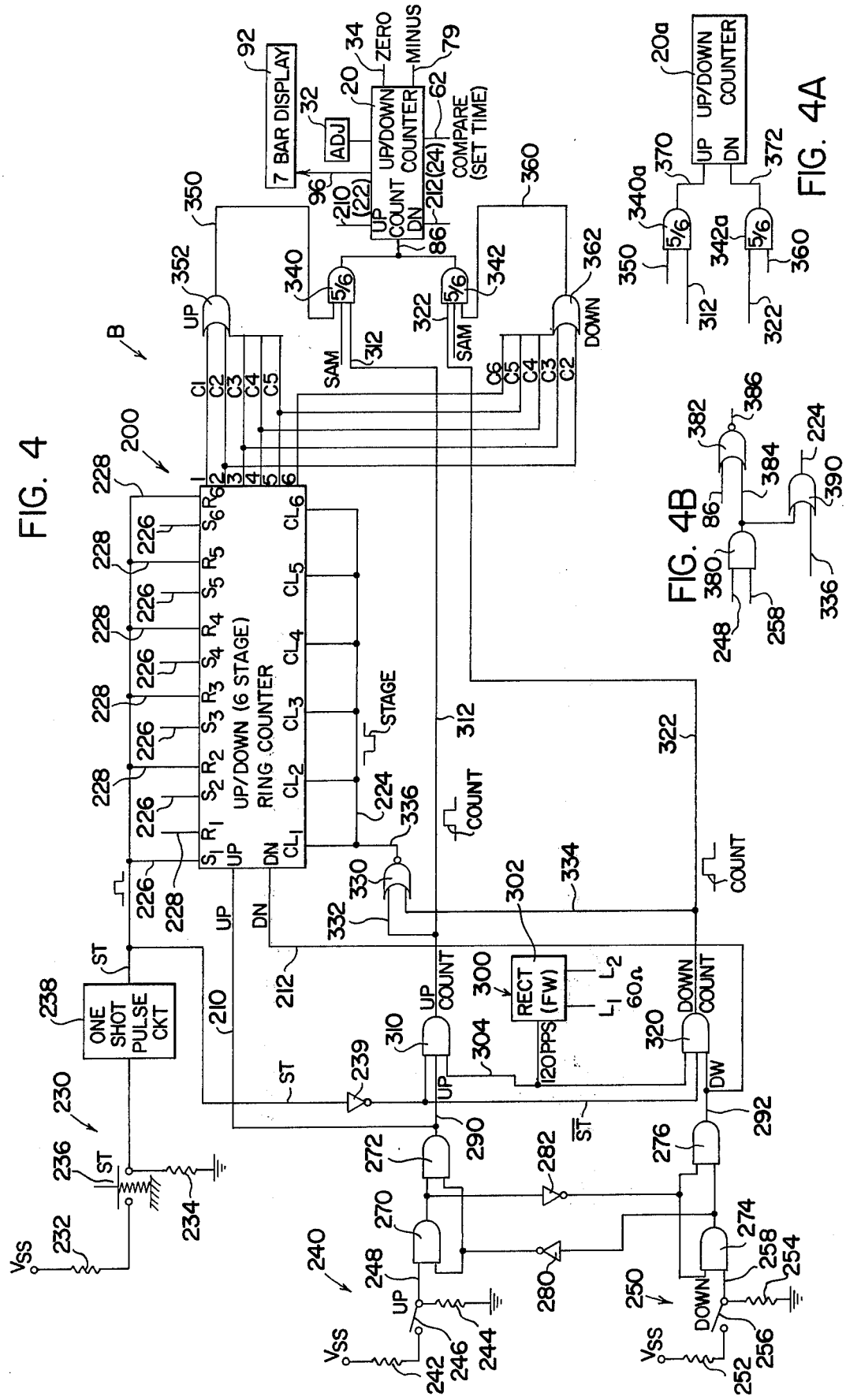

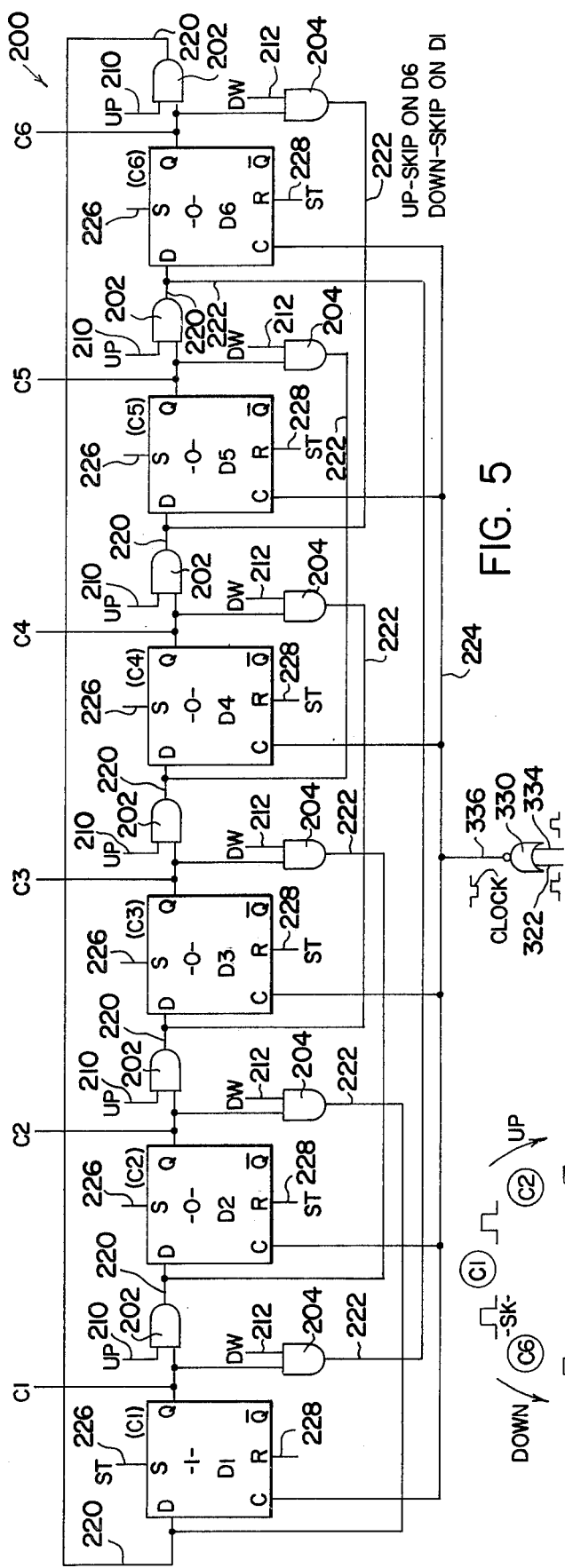

UP/DOWN COUNTER WITH A TRACKING 5/6 INPUT CIRCUIT

This application is a continuation-in-part of application Ser. No. 478,979, filed June 13, 1974, now U.S. Pat. No. 3,930,142.

This invention relates to the art of digital timing by counting and more particularly to an improved up/down counter with a 5/6 divider capability wherein the 5/6 inputs track in both the up and down counting modes.

The invention is particularly applicable for use with a 120 pps incoming counting pulse which is divided to allow counting of five out of six incoming pulses and it will be described with particular reference thereto; however, it is appreciated that the invention is much broader and may be used in timing cycles wherein a digital counter is controlled by an incoming pulse train having a time base frequency evenly divisible by six, such as 60 cycles per second.

INCORPORATION BY REFERENCE

Prior U.S. Pat. Nos. 3,789,195 and 3,867,614 each relate to a counting system having what is known as a 5/6 operating mode for a programmable input divider system and these two patents are incorporated by reference herein. In addition, prior application Ser. No. 478,976 filed on June 13, 1974, by the same inventor now U.S. Pat. No. 3,930,142 is also incorporated by reference herein. In addition, this application is a continuation-in-part of said prior application.

BACKGROUND OF INVENTION

There has developed a substantial need for a digital counting system which can be used for counting or timing. When timing, the input pulses to the system have a known time base frequency so that by counting the pulses a timing operation is obtained. In these systems, it is desirable, when timing, to provide a readout in tenths or hundredths of a second. Since the time base frequency most commonly available is line frequency of 60 cycles per second, or the rectified 120 pps, timing in hundredths of a second has been somewhat difficult. Originally, to obtain these portions of a second, the 60 cycle line frequency was multiplied and divided in complex digital circuits which required a substantial amount of space on an LSI chip. These arrangements have been unsatisfactory. Thus, the programmable controller for 5/6 operations was developed and is set forth in prior U.S. Pat. Nos. 3,789,195 and 3,867,614. This type of system passes five out of six pulses from the incoming pulse to the counter. In this manner, if a full wave rectifier is used to produce 120 pps, 100 pulses can be created at the counter during each second. This provides a convenient, simplified system for producing fractional timing using a digital counter.

As disclosed in prior application Ser. No. 478,979 filed June 13, 1974, there has been developed a demand for a counting and timing system which can be used to totalize either time or counts. In this type of system, a combined up/down digital counter is employed which counts or times one direction when receiving pulses from a first input and in the other direction when receiving pulses from a second input. By dividing these input pulses with a 5/6 control, the counter can totalize time by recording time on one input terminal and time on another input terminal in a subtractive mode. In the past, the systems for passing five pulses out of six has included an arrangement wherein the sixth pulse is dropped or inhibited out of each group of six incoming pulses. By employing this type of system, when timing in two different directions, it is possible to reverse the timing directions at the time when an inhibit signal is created. When this happens, the time in the opposite direction does not actually track exactly the time in the first direction. This can cause an error of 8.33 ms in totalizing time using a 5/6 system, as disclosed in the prior patents and application. The present application relates to an improvement when totalizing time using a 5/6 circuit, wherein the timing in both directions exactly tracks each other so that the inhibit signal in either counting direction occurs at the same progressively totalized count position or positions. In other words, when counting in the first direction if the inhibit signal occurs on the sixth pulse, when counting down or in the other direction, the inhibit signal occurs at the same location on the progressive counting cycle. Assume that timing in one direction requires seven pulses causing the counter to record the number six. When counting in the other direction from the number six, the inhibit signal will occur on the second pulse. In the past, the inhibit signal would have occured again on the sixth pulse in the opposite direction which would prevent tracking in both directions when in the 5/6 timing mode. By using the present invention, tracking in both directions is assured so that the inhibit signal occurs at the same progressively totalized count position to eliminate the previous possible error of 8.33 ms.

In the past, the only suggestion for decreasing the possible error when totalizing time in the 5/6 mode has been to increase the frequency of the counting pulses. For instance, if the timing pulses were increased to 240 pps, a possible error of only 4.17 ms could occur. This error still is unsatisfactory in some operations, but it is less than normally experienced. By again multiplying the incoming pulses, the error can be progressively reduced. However, multiplying circuits at the input of the timing system are expensive and require a substantial increase in components. In addition, the counter must have higher capacity to handle the higher frequency. Thus, the present invention is a substantial improvement over the prior system without requiring the expense of multiplication circuitry and higher capacity digital counting circuits.

THE INVENTION

In accordance with the present invention, there is provided an improvement in the timing system described above using an up/down digital counter and two inputs for totalizing time by using the 5/6 input mode, which improvement includes a sequence control means for causing the first and second 5/6 input means to inhibit one out of six pulses at identical progressively totalized count positions, irrespective of the vector direction of the counting operation.

The primary object of the present invention is the provision of a timing system using an up/down digital counter for totalizing by counting in one direction (up) in response to timing pulses from a first input and counting in the opposite direction (down) in response to timing pulses from a second input, which system uses the 5/6 pulse inhibit concept and prevents errors due to random pulse inhibiting.

Yet another object of the present invention is the provision of a timing system as defined above, which system uses a sequence control device for causing tracking of the inhibit position of the up counting and down counting operation of the digital counter.

Yet another object of the present invention is the provision of a timing system as defined above, which system includes a sequence control device that is a ring counter stageable, or shiftable, on each incoming pulse with staging in a first direction when timing is in the up direction and staging in the opposite direction when timing is in the down direction.

Still a further object of the present invention is the provision of a timing system as defined above which can be easily incorporated into existing up/down timing circuits to give a 5/6 mode of operation and tracking of the inhibited pulse in both the up and down counting directions.

These and other objects and advantages will become apparent from the following description taken together with the accompanying drawings.

BRIEF DESCRIPTION OF DRAWINGS

FIG. 4 is a schematic logic wiring diagram illustrating the preferred embodiment of the present invention adapted for use in a system as illustrated in FIG. 1;

FIG. 4A is a partial schematic diagram illustrating the modification of the preferred embodiment illustrated in FIG. 4;

FIG. 4B is a schematic logic circuit for holding the up/down counter at a selected number when the counting circuit of FIG. 4 attempts to count up and down simultaneously;

FIG. 5 is a schematic logic diagram of the up/down ring counter using the preferred embodiment of the present invention;

FIG. 6 is a flow chart illustrating schematically the operation of the ring counter shown in FIG. 5; and, FIG. 7 is a chart illustrating the operating characteristics of the present invention compared to the operating characteristics of the prior art.

DESCRIPTION OF THE PREFERRED EMBODIMENT

Figure 1:
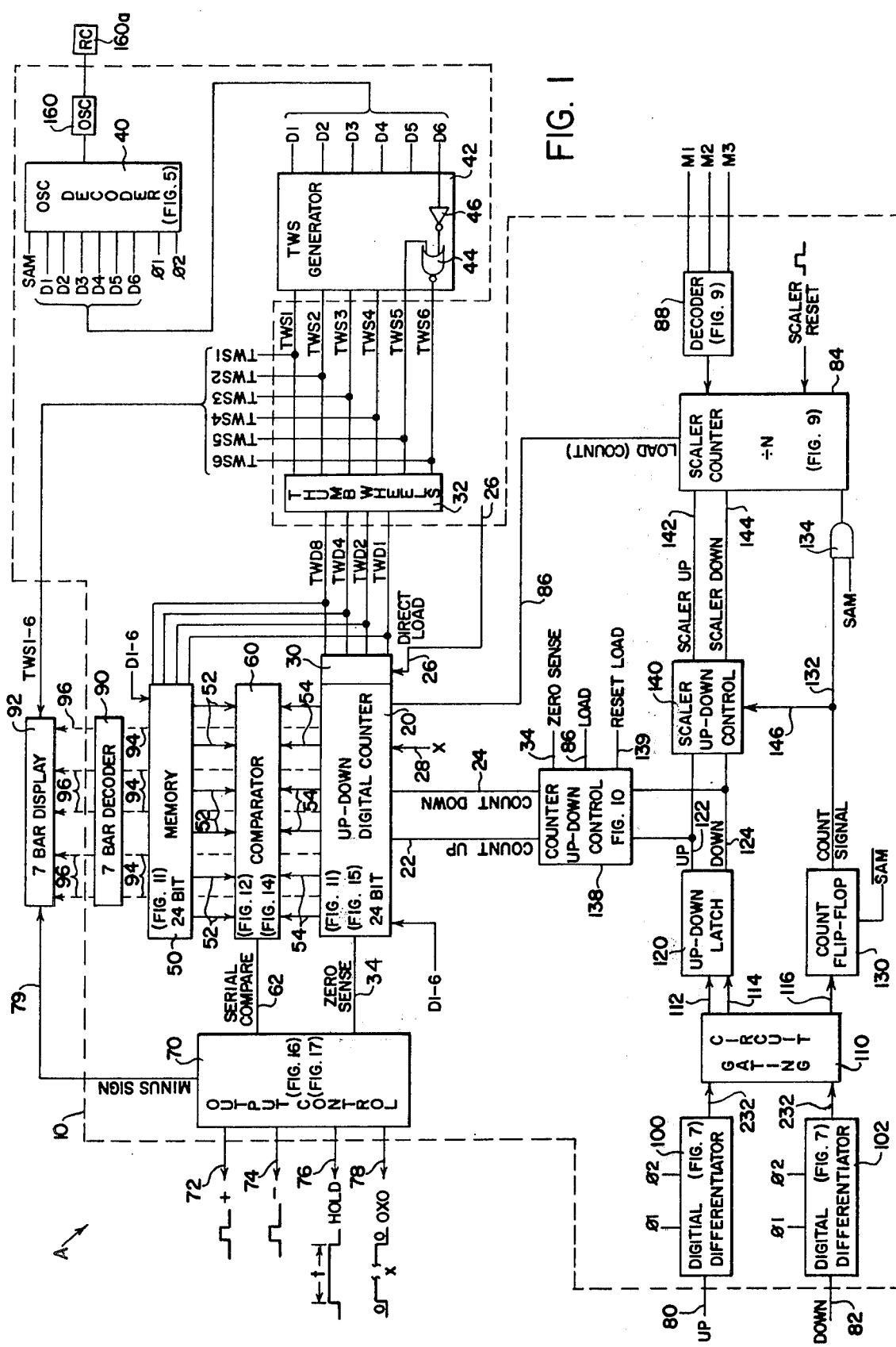
FIG. 1 is a schematic block diagram illustrating a counting and timing system as disclosed in prior application Ser. No. 478,979, filed June 13, 1974, and to which the present invention is particularly adapted.

The present invention relates to a device which can be used in an up/down digital counter of the type shown in FIG. 1 for allowing up timing and down timing from two input terminals without causing error in the visible readout at any given time by providing identical tracking in the up and down directions when the up/down counter is used in a 5/6 mode on the up and down counting terminals. Before describing the preferred embodiment of the invention, a counting device of FIGS. 1, 2 and 3, which is identical to the disclosure of prior patent application Ser. No. 478,979 filed June 13, 1974, will be set forth. This application is a continuation-in-part of that prior application.

GENERAL DESCRIPTION OF A DIGITAL COUNTING DEVICE IN WHICH THE INVENTION IS USED

Referring now to the drawings wherein the showings are for the purpose of illustrating the preferred embodiment of the invention only, and not for the purpose of limiting same, FIG. 1 shows, somewhat schematically, a digital counting device A which utilizes a LSI chip 10 designated by the dashed lines. This device is modified in the preferred embodiment of the invention. The components within the dashed lines are produced on the chip in accordance with standard MOS-FET technology. The chip 10 includes circuitry for processing six digits which can be loaded either directly into the six digit, 24 bit counter 20 or a six digit, 24 bit memory circuit 50. The digits are selected externally of chip 10 by an appropriate coding arrangement, such as thumbwheel networks, schematically represented as block 32. Chip 10 includes two primary outputs labeled + and −. The + output changes stage and creates a signal when the counter counts up and reaches the memory number when in the $\overline{\text{LOAD DIRECT}}$ mode or reaches zero when in the LOAD DIRECT mode. The − output changes state and creates a signal when the counter reaches a set number loaded into the memory circuit. Each of the two primary outputs can be held for a selected time, such as 50 ms when the HOLD output is energized. There are two separate inputs to the chip 10. One input is labeled UP and is used for up counting. The second input is labeled DOWN and is for down counting. Each of these inputs is directed through a divider network or scaler counter 84 which can be programmed so that the internal counting is a multiple of input pulses directed to the chip on the two input terminals. When either of the inputs is connected to a known frequency, such as 120 cps, the counter operates as a timer and the divider network or scaler counter determines the range of the timing cycle. There is included within chip 10 digital differentiators 100, 102 and a gating circuit 110 which prevent counting when pulses are applied simultaneously to the two input terminals of chip 10. In addition, these differentiators and the gating circuit determine the terminal on which an input pulse is received so that the counter in chip 10 functions in accordance with the mode indicated by the input terminal being used.

The 24 bit binary up/down counter 20 can accommodate six digits each including four binary stages. Of course, various changes could be made in the number of digits and bits. Binary counter 20 includes four sections or stages for each digit. Each digit is loaded into the counter as a binary coded digit in accordance with normal counting practices. Line 22, the COUNT UP line, causes the counter to count in the up mode when a signal is applied to line 22. In a like manner, a signal applied to the COUNT DOWN line 24 causes counter 20 to count down. Combined up and down counters are quite well known in the LSI chip field and take a variety of different constructions. Control line 26, designated the DIRECT LOAD line, allows loading of counter 20 when a given logic is applied to this line. When opposite logic, designated as $\overline{\text{DIRECT LOAD}}$, is applied to this line, loading of the counter itself is inhibited. Line 28 is designated as the X line. This causes a divide by six function at digits three and five from the most significant end of the six digit binary counter 20.

Figure 2:
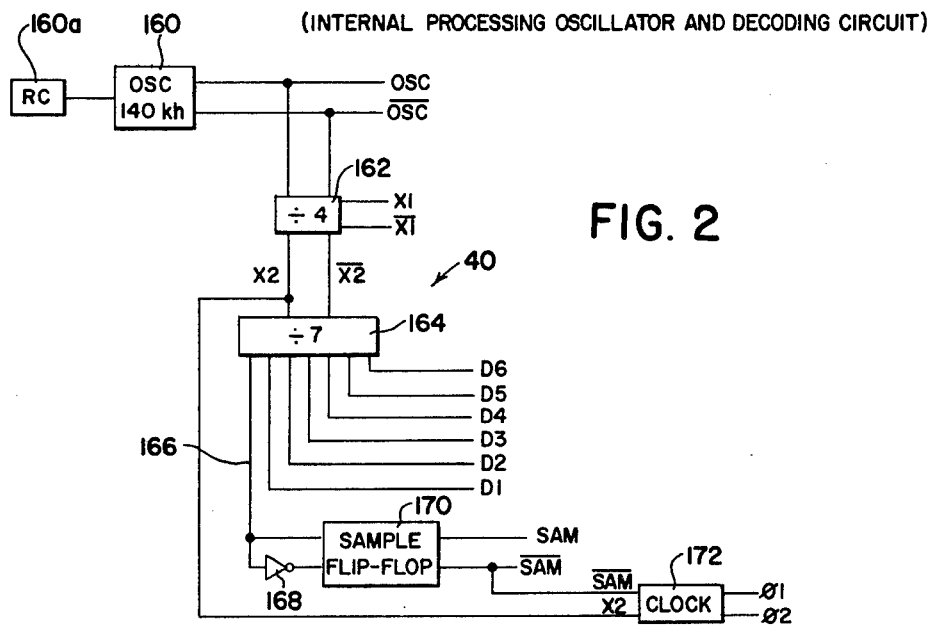
FIG. 2 is a schematic block diagram illustrating the system of the prior application for creating the various control pulses for the system illustrated in FIG. 1.

When loading the six digits into binary counter 20, multiplexing lines D1–D6 are created in series by an oscillator and decoder 40 best shown in FIG. 2. As will be explained later, a number is loaded into counter 20 only when device A is being operated in the DIRECT LOAD mode, i.e. when the counting device is to count down from a number to zero. In this mode, when multiplexing pulse D1 appears, the binary logic on four binary coded decimal lines designated TWD8, TWD4, TWD2 and TWD1 is loaded into the first of the four bit digit stages of counter 20. When a D2 multiplexing pulse is created, after a D1 pulse, new binary coded decimal logic appears on the TWD lines. This new logic represents a second digit and is loaded into the second digit stage of counter 20. This is repeated until all of the multiplexing pulses D1–D6 have been created and have loaded the corresponding binary coded decimal information from the TWD lines into the respective six stages of counter 20. Each of the multiplexing lines D1–D6 opens one of the four bit binary digit stages of counter 20 for reception of multiplexed information appearing on the TWD lines in a manner to be described later. The TWD lines are gated through the DIRECT LOAD gate 30 included as part of the counter circuitry and controlled by logic on DIRECT LOAD line 26. When gate 30 is open, loading of counter 20 can take place. When the logic on line 26 closes this gate, the information on the TWD lines cannot pass into the counter.

The logic on the TWS lines is created for multiplexing. A series of thumbwheels, shown as a schematically represented thumbwheel device 32 in FIG. 1, are each adjusted to provide a particular four bit binary coded network for each of the six digits. Six manually adjusted thumbwheels are used in device 32. When one of the multiplexing lines D1–D6 appears, it creates a corresponding TWS pulse which is directed to one of the six binary coded thumbwheel networks in thumbwheel device 32. Each TWS pulse produces a particular binary coded digit set into one stage of device 32 by manually moving the various thumbwheels in accordance with known practice. The binary coded decimal set into each stage of thumbwheel device 32 is directed simultaneously to the four TWD lines, TWD8, TWD4, TWD2, and TWD1. The information on the TWD lines is introduced through the DIRECT LOAD gate 30 into counter 20. It is seen that separate digits are loaded into separate locations in counter 20 under the control of one of the multiplexing lines D1–D6. The output of counter 20 is a ZERO SENSE line 34. A signal appears on this line when the counter 20 has been counted to zero in all six digit stages.

The multiplexing pulses on lines D1–D6 are created by the multiplex decoder 40 shown schematically in FIG. 1 and in more detail in FIG. 2. Multiplexing lines D1–D6 are connected to a TWS generator 42, to create pulses on the thumbwheel selector lines TWS 1–6. Essentially, a pulse on one of the multiplexing lines D1–D6 creates a corresponding pulse on one of the TWS lines. To assure that there is no overlapping between adjacent pulses on the TWS lines, generator 42 includes a NOR gate 44 for each TWS line. Gate 44 has a first input connected to one of the multiplexing lines D1–6 through an inverter 46. The other input to gate 44 is connected to the next adjacent TWS line. Consequently, in order to develop a signal in a subsequent TWS line, such as TWS-6 as represented in block 42 of FIG. 1, the signal on the previous TWS line, i.e. TWS-5, must be zero at the same time that a multiplexing pulse is received on line D6. In this manner, one TWS line must become inactive before the next TWS line can become active. The adjacent multiplexing pulses which appear in lines D1–D6 are not spaced from each other. Consequently, the interconnecting gate arrangement schematically illustrated in FIG. 1 is one scheme to assure that concurrent TWS pulses are not created. A gate 44 is not required for TWS-1 since D1 does not follow immediately after D6.

This description of the multiplexing line D1–6, the thumbwheel selector lines TWS 1–6, and the thumbwheel decoder lines TWD 8–1 show how these lines are coordinated to multiplex digits into count 20. The same basic system is used for multiplexing digits set in thumbwheel device 32 into a 24 bit read/write memory circuit 50. In accordance with the preferred embodiment of the invention, the thumbwheel decoder lines TWS 8–1 are directed to the memory circuit 50 and are multiplexed into the various digits by the multiplex lines D1–D6. The multiplexing of the thumbwheel setting of device 32 into the memory circuit 50 and/or the counter 20 is controlled by a gate which is operated only at the start of a counting cycle.

During the counting cycle, lines 52 which read the binary information set into memory circuit 50 and lines 54 which read the binary information in counter 20 are both directed to a compare circuit 60. When the counter 20 is counted up to the setting of memory circuit 50, compare circuit 60 creates a SERIAL COMPARE signal in line 62.

The ZERO SENSE line 34 and the SERIAL COMPARE line 62 are connected to an output control 70 having four outputs 72, 74, 76 and 78. Output 72 is referred to as the + output. Line 74 is the − output. Line 76 is the HOLD output and line 78 is the OXO output. A last output is line 79 which controls the minus sign of the visual display unit 92.

LSI chip 10 includes two terminals forming pulse input lines 80, 82. Line 80 is the UP input, and line 82 is the DOWN input. Input pulses on either of the inputs are directed through certain input circuitry shown in FIG. 1 and described later. The pulses are divided by a pulse divider or scaler counter 84, which is controlled by the logic on code lines M1, M2, M3. An output pulse is created by scaler counter 84 after a given number of input pulses. This pulse is developed in the LOAD or COUNT line 86. The logic of the coded lines M1, M2, M3, which can be manually changed to change the counting range, is decoded by a standard binary decoder 88.

The condition of counter 20 at any given time is directed to a 7-Bar decoder 90 which receives the binary coded decimal for each digit in counter 20 by the operation multiplex lines D1–D6. Decoder 90 controls the 7-Bar visual display 92. The input lines to the decoder are labeled 94 and the output lines connected to display 92 are labeled 96. The 7-Bar display is controlled by the TWS lines 1–6 to coordinate the stage of the display device wth the stages of counter 20 being interrogated serially by multiplexing lines D1–6.

Referring now more particularly to the input circuits for the digital counting device A, as shown in FIG. 1. The UP input 80 is connected to a digital differentiator 100 and the DOWN input 82 is connected to digital differentiator 102. These differentiators are controlled by clocking pulses 01, 02 created by the decoder 40 shown in FIG. 2. These clocking pulses advance the signals on the input lines 80, 82 into the input of a gating circuit 110. The first input signal appearing on one of the input lines is started in its gating progress through the differentiator. The next input signal, if on another of the inputs, then progresses behind the first signal to the gating circuit 110 which includes outputs 112, 114 and 116. Outputs 112, 114 carry logic which indicates whether the input signal being accepted by gating circuit 110 is from the UP input 80 of the DOWN input 82. The logic on lines 112, 114 is then used to control an UP-DOWN latch 120 which can be a somewhat standard flip-flop. If the input signal is on the UP line 80, latch 120 activates UP line 122. If the input signal is on DOWN line 82, latch 120 activates DOWN line 124. If two input signals are progressed through the differentiators 100, 102, at the same time, output 116 resets a COUNT flip-flop 130 to a zero output on COUNT SIGNAL line 132. Simultaneous signals on both the UP line 80 and DOWN line 82 are progressed through the differentiators 100, 102 at the same time by clocking pulses 01, 02. This condition prevents a COUNT SIGNAL in line 132. When either an up signal or a down signal is progressed through the respective differentiators, the UP-DOWN latch 120 is set in accordance with the particular signal and COUNT flip-flop 130 is toggled to a logic on line 132 indicating that a count is to be made at scaler counter 84. For the purpose of making the actual count, an AND gate 134 is controlled by the SAM line. This line is an operating or processing strobe which has a width similar to the width of the multiplex lines D1–6 and occurs between D6 and D1. Generation of the SAM signal on the SAM line will be described in connection with the showing of FIGS. 2 and 3. UP line 122 and DOWN line 124 are directed to the counter up-down control 138. This counter control is operated in response to the logic on UP line 122 and DOWN line 124, together with certain other signals, such as the logic on the ZERO SENSE line 34, logic on LOAD or COUNT line 86 and the logic on RESET LOAD line 139. The outputs of circuit 138 are the COUNT UP and COUNT DOWN lines 22, 24, respectively. The scaler up-down control 140 produces a SCALER UP output on line 142 and a SCALER DOWN output on line 144. These are outputs directed to the scaler 84 to determine whether or not the scaler counter should count up or down in accordance with the count signal received upon line 132 through gate 134. In this manner, the scaler is capable of counting up and counting down as well as dividing the pulses on line 32 by a number set by the code on lines M1, M2 and M3. Consequently, the scaler counter is capable of totalizing in both directions while dividing by a selected number. The output of scaler up-down control 140 is synchronized with the particular incoming signal by an appropriate means represented by synchronizing line 146.

In the $\overline{\text{DIRECT LOAD}}$ mode the logic on line 26 prevents loading of the thumbwheel decoding lines TWD1–6 into counter 20. At the start of the cycle, a reset signal clears counter 20 and the memory circuit 50. Thereafter, the information from the thumbwheel device 32 is multiplexed into the memory 50 by serial insertion from the TWS lines. No information from the TWD lines is loaded into counter 20 since line 26 blocks gate 30. Consequently, the thumbwheel settings of device 32 are loaded into only memory circuit 50. The counter is reset to zero. Thereafter, the input pulses are directed to the input by the UP input line 80.

The input pulses pass through a digital differentiator 100 to control the gating circuit 110. The up-down latch 120 actuates lines 122, 124 to indicate that the up counting mode is being used. This causes control 138 to actuate COUNT UP line 22. In this same manner, the scaler counter 84 is controlled by lines 142, 144 to count in the up direction. As the input pulses continue, they are directed through count flip-flop 30 to gate 134 by line 132. This causes up counting of counter 20 upon the appearance of each pulse in the LOAD or COUNT line 86. When the memory circuit logic being read by lines 52 matches the counter logic being read by lines 54, comparator 60 is energized to produce a SERIAL COMPARE signal in line 62. This, like the ZERO SENSE signal, actuates the output control 70. A down count on line 82 can be accepted in this mode to reduce the total on counter 20. When there is a SERIAL COMPARE signal, the + output is at a logic 1 and the negative output shifts to a logic 1 which is a negative pulse.

INTERNAL PROCESSING OSCILLATOR AND DECODING CIRCUIT

Figure 3:
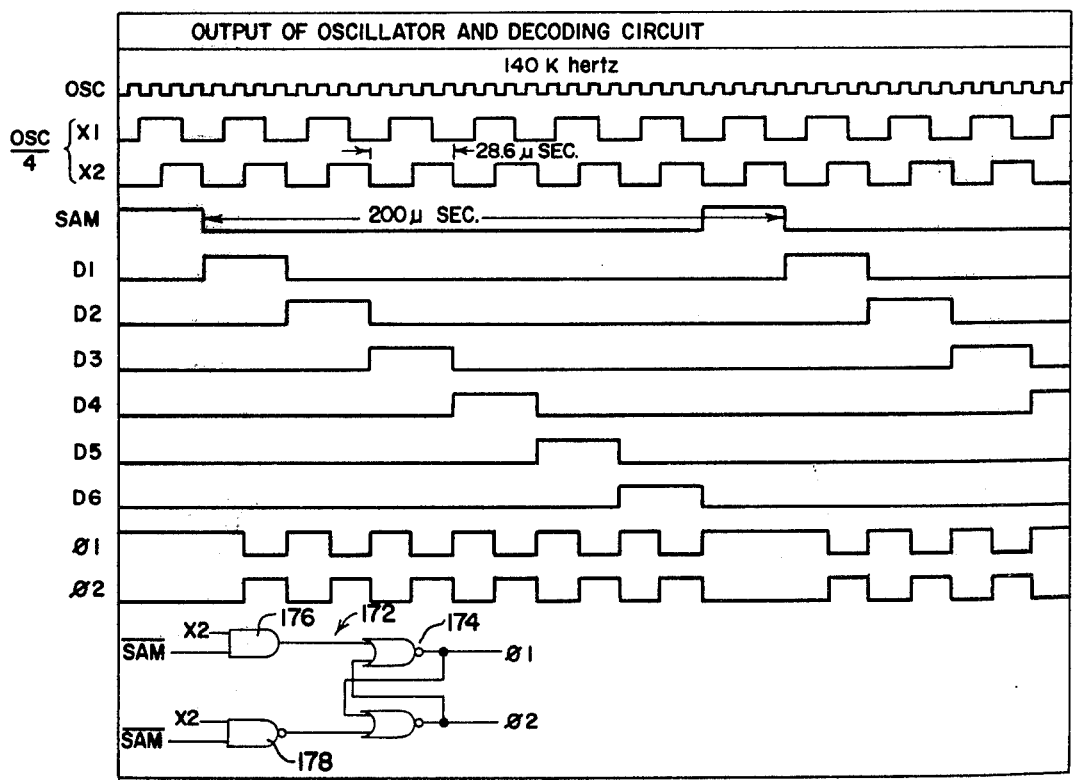
FIG. 3 is a pulse diagram illustrating the pulsing characteristics of the circuit illustrated in FIG. 2.

Referring now more particularly to FIGS. 2 and 3, the multiplex decoder 40 is shown as a part of the total internal processing oscillator and decoder circuit. This circuit includes an oscillator 160 controlled by an external RC circuit 160a to oscillate at a selected frequency, which in the preferred embodiment of the invention is 140 kilohertz. The outputs of oscillator 160 are lines OSC and $\overline{\text{OSC}}$. Oscillator lines OSC, $\overline{\text{OSC}}$ control a divide-by-four divider circuit 162 which produces output pulses on lines X1, $\overline{\text{X1}}$ and X2, $\overline{\text{X2}}$. The pulsing lines X2, $\overline{\text{X2}}$ are directed to a divide-by-seven counter circuit 164 having seven outputs, the first being line 166. The remaining output lines are the multiplexing lines D1–6 which receive successive multiplexing pulses. Line 166 includes an inverter 168 so that the inverted and non-inverted logic on this line can be directed to a SAMPLE flip-flop 170 for producing logic 1 pulses successively in the SAM and $\overline{\text{SAM}}$ lines. $\overline{\text{SAM}}$ and X2 control a clocking circuit 172 having output clocking pulses 01, 02. This clocking circuit can include a variety of designs; however, one design is illustrated in the lower portion of FIG. 6. This representative logic circuit includes a flip-flop 174 controlled by AND gate 176 and NAND gate 178. These two gates receive X2 and $\overline{\text{SAM}}$ signals to control the output lines 01, 02.

The wave shapes created by the circuit in FIG. 2 are illustrated in FIG. 3. Oscillator lines OSC, $\overline{\text{OSC}}$ are oscillating at a frequency of 140 kilohertz; therefore, the X1, X2 pulses have a frequency of ¼ of that amount and occur each 28.6 μ s. The output of divide-by-seven circuit 164 produces seven separate and distinct pulses, each of which occurs once each 200 μ s. The chart of FIG. 6 shows that after a SAM pulse is received, the D1–D6 multiplexing pulses occur in succession. The lower two graphs illustrate the 01, 02 clocking pulses created by the clocking circuit 172 shown in FIG. 6. These pulses occur internally of chip 10 and are quite rapid. During the SAM pulse, most logic functions of the digital counting device A are performed. During the subsequent multiplexing pulses, various multiplexing functions are performed. As can be seen in FIG. 3, all functions are performed within about 200 μ s. When device A is used for timing, a 120 pps input at either terminals 80, 82 will produce a pulse approximately each 8.33 ms. Thus, the internal processing is completed and awaiting a new pulse a majority of the time. Consequently, many cycles of the circuit shown in FIG. 2 occur during and between each incoming pulse. When counting is being accomplished by the digital counting device A, the pulses are usually more random. Obviously, they do not approach the rapidity of the internal oscillating circuits. For this reason, the internal circuits are stabilized between input pulses by a series of separate cycles of the internal processing oscillator and decoder circuit shown in FIG. 2 and having the wave shapes disclosed in FIG. 3.

TRACKING INPUT CIRCUIT

In accordance with the preferred embodiment of the present invention as best shown in FIGS. 4 and 5, there is provided an input circuit B which combines the 5/6 inhibit mode of operation in a memory arrangement for tracking both up and down counting so that the inhibited one pulse in each six pulses applied to the up/down counter 20 occurs in the same progressively totalized count position. In this manner, the 7-Bar display 92 provides the exact reading corresponding to the summation of up and down timing, which is the vector or absolute summation of counting, which is added and subtracted by counter 20. In accordance with the preferred embodiment of the invention, input circuit B includes an up/down ring counter 200, best shown in FIG. 5, and having six separate stages labeled C1–C6, with each of the stages being formed from a somewhat standard D-type flip-flop having the standard terminals D, C, Q, $\overline{Q}$, R and S. Referring more particularly to FIG. 5, the up/down ring counter includes up steering AND gates 202 and down steering AND gates 204. Steering lines 210, 212 receive a logic 1 when the counting mode is up or down, respectively. The steering gates 202 have outputs 220 which are shown in FIG. 5 for shifting or staging ring counter 200 to the right during successive up counts of input circuit B. This staging occurs upon each incoming up count pulse irrespective of whether the pulse is transmitted to counter 20 or inhibited, as required to produce the 5/6 mode of operation. In a like manner, down steering gates 204 have outputs 222 which are connected, as shown in FIG. 5, to stage or shift ring counter 200 to the left. Thus, when counting or timing in a first direction, referred to herein as "up", ring counter 200 progresses from stage C1 to stage C6 and then repeats this staging as successive up counting pulses are received. In a similar manner, ring counter 200 is progressed from stage C6 to stage C1 when counting pulses representing a second direction are received. This second direction is referred herein as "down". Subsequent down pulses recycle ring counter 200 and repeat this process. If a shift occurs between up counting and down counting at any particular stage in ring counter 200, steering lines 210, 212 determine the staging or shifting direction of the ring counter. Shifting or staging of the ring counter is caused by the logic on clocking line 224 which will clock or shift the ring counter in the direction determined by steering lines 210, 212 when the logic on line 224 shifts from logic 0 to logic 1. Thus, clocking or ring counter 200 occurs upon the positive going portion of the logic in line 224 which causes staging after counting has occurred for each separate input pulse.

In the preferred embodiment of the invention, a logic 1 is inserted in stage C1 of ring counter 200 prior to operation of input circuit B. To accomplish this, various input circuits could be devised. In accordance with the illustrated embodiment, input circuit 230 includes a pull up resistor 232, a pull down resistor 234 and a momentary operated switch 236 which triggers a one shot device 238 having an output line ST which receives a short positive pulse when switch 236 is closed. The pulse is determined by the closing of the switch and not by the length of time that the switch is closed. After the switch is first closed, a logic 1 appears in the ST line. This applies a logic 1 to the S terminal in stage C1 and a logic 1 to the R terminals of stages C2–C6. Consequently, a logic 1 is entered into the first stage C1 of ring counter 200 at the start of circuit B, as illustrated in FIG. 5. Of course, a logic 1 could be entered into any of the stages without departing from the intended spirit and scope of the invention. After switch 236 is first closed, circuit B is ready for receiving input pulses from each of two separate input circuits. Starting circuit 230 assures that a logic 1 is in only one stage of ring counter 200 during operation of the input circuit B.

The first input circuit is the up counting or timing input starting circuit 240 which produces a logic indicating that counting or timing is to occur in a selected direction. Various circuits could be used for this purpose; however, in the illustrated embodiment of the invention, circuit 240 includes a pull up resistor 242, a pull down resistor 244, a switch 246 and an output line 248. Switch 246 is closed when circuit B is to count in a selected first direction, indicated as up in the illustrated embodiment. Of course, this switch could be an electronic switching circuit instead of the illustrated mechanical switching circuit without departing from the intended spirit and scope of the invention. The second input circuit is the starting circuit 250 for down counting or timing. As in circuit 240, this illustrated circuit 250 includes a pull up resistor 252, a pull down resistor 254, a mechanical switch 256 and an output down counting or timing line 258. As so far described, the time that switches 246, 256 are closed is subtracted from each other so that 7-Bar display 92 reads the exact difference in time between these switch closings. In this operation, the switches can not be closed at the same time. If the total time that switch 256 is closed is greater than the total time that switch 246 is closed, the minus sign line 79 is actuated to produce a minus sign in display 92. If counter 20 is to be operated when the closed time of switch 246 equals the closed time of switch 256, a ZERO SENSE signal is received from line 34 when the totalizing of the two time inputs is zero. If a signal is to be created when the totalized time reaches a present time controlled by thumbwheel circuit 32, an output is received on line 62 when this totalized time value has been realized. These features have been described in more detail with respect to the circuits shown in FIGS. 1, 2, and 3. By using the present invention, the outputs desired are obtained at the exact pulse. In the prior art, in some instances an output could be obtained which is shifted 8.33 ms from the actual desired output. In addition, display 92 always displays the proper time. In the prior art, this display could be off 8.33 ms under certain operating conditions during totalizing of the actual time between the two input circuits 240, 250.

Referring now in more detail to the preferred embodiment of the invention, a simplified anti-coincidence circuit 260 is provided so that counts can be passed through the circuit at any given time for counting in only the up or down mode. Many circuits could be devised for this purpose, however, in accordance with the illustrated embodiment of the invention, anti-coincidence circuit 260 includes AND gates 270, 272, 274 and 276 and inverters 280, 282. The anti-coincidence circuit includes output lines 290, 292 which correspond to steering lines 210, 212, respectively. In this manner, up/down ring counter 200 can be steered in only one direction at any given time. This prevents a loss of the logic 1 which is progressing from stage-to-stage in the ring counter.

In accordance with the illustrated embodiment, pulse source 300 provides a pulse train with a time base frequency evenly divisible by six. In the preferred embodiment, input lines $L_1$, $L_2$ are normal line frequency having a time base frequency of 60 cycles per second. A full wave rectifier and pulse shaper 302 produces 120 pulses per second in the output line 304. If this pulse train is subjected to a circuit which inhibits one pulse in six pulses, 100 pulses per second will be used in the counting operation. Circuit B provides an arrangement for accomplishing this purpose, which will be described later. During up counting or counting in a selected direction, the up counting pulse gate 310 is active. This pulse gate includes inputs $\overline{ST}$, 290 and 304 and an output 312. Except during starting, $\overline{ST}$ is at a logic 1. When switch 246 is closed, a logic 1 appears in line 190. Thus, when circuit 240 is actuated for up counting, the 120 pps pulse train in line 304 passes through the up counting pulse gate 310 to the output 312. In a like manner, down counting pulse gate 320 includes inputs $\overline{ST}$, 292 and 304 and an output 322. When the down counting circuit 250 is actuated after a starting pulse in line ST, inputs $\overline{ST}$ and 292 are both at a logic 1. This passes the 120 pps pulse train of line 304 to output 322. Thus, during up counting, the 120 pps train is applied to the up count line 312 and steering line 210 causes up staging of ring counter 200. To stage or clock ring counter 200, there is provided a clocking gate 330 having inputs 332, 334 and an output 336 connected to clocking line 224. Thus, upon receipt of a pulse from either line 332, 334, ring counter 200 is staged in a direction determined by the logic of steering lines 210, 212.

To inhibit one pulse in six from being counted by counter 20, there is provided two 5/6 passage devices 340, 342. These devices inhibit one out of each six incoming pulses on line 312, 322 in a manner quite apparent from FIGS. 4 and 5. Passage device 340 is an AND gate having three inputs. The first input is SAM which is the window pulse for updating the condition of counter 20, as previously described with respect to FIG. 3. The SAM pulse occurs several times during each counting pulse to provide an effective real time. The second input to gate 340 is line 312 which receives up counting pulses from gate 310. The third input is line 350 which is connected to the output of OR gate 352 having five inputs corresponding to the Q logic of stages C1–C5 of ring counter 200. In a similar manner, the second 5/6 passage device 342 includes inputs 322, SAM and a line 360. This line is the output of OR gate 362 which has five inputs corresponding to the Q logic of stages C2–C6 of ring counter 200. The first passage device 340 is operative when up counting pulses are being counted. The second passage device 342 is operative during down counting, if pulses are received from gate 320 in line 322. Line 86, as shown in FIG. 1, causes counting of counter 20 in the direction determined by the logic on lines 210, 212 which are the steering lines 22, 24 respectively, shown in FIG. 1.

Referring now to FIG. 6, the operating characteristics of input circuit B are schematically illustrated. When up counting, or timing in a given direction, ring counter 200 progresses as indicated by the UP arrow. The counting pulses are illustrated in between the staging conditions of the ring counter. Thus, if the logic 1 of ring counter 200 is in stage C1, the next up count is passed through gate 352 and gate 340 to counter 20. This continues until the logic 1 appears at stage C6. When that occurs, there is no logic 1 at the input of gate 352, as shown in FIG. 4. Thus, the next up counting pulse is skipped as indicated by the label SK. Consequently, as there is a continued counting of time with up switch 246 closed, one pulse is dropped each time ring counter 200 has a logic 1 in stage C6. Assuming now that at a given position, up timing is discontinued by opening switch 246. This applies to logic 0 to line 248. This produces a logic 0 at the output of AND gate 270 and a logic 0 in line 290. AND gate 310 is inhibited. Ring counter 200 then remains in the staged position immediately prior to the removal of a timing signal. If switch 256 is now closed, a logic 1 appears in line 292, to open gate 320 for down counting or counting in a direction opposite to counting during the closed condition of switch 246. When this happens, steering gates 204 are activated and ring counter 200 progresses in the direction indicated by the DOWN arrow of FIG. 6. Thus, when a logic 1 appears in the C1 stage, the next pulse is skipped. This is apparent from gate 362 which does not have an input connected to stage C1 of ring counter 200. The operation, as indicated in FIG. 6, continues as best described in connection with up counting. One pulse in six is inhibited after the logic 1 appears in stage C1 of the ring counter. As previously mentioned, after a count has been received, counter 200 is staged. Consequently, if the up counting is stopped on a skipped or inhibited pulse, counter 200 is staged to C1. Thus, on the next incoming down pulse, the first pulse is inhibited or skipped because stage C1 is the skip stage for down counting. Thus, the inhibited pulse occurs at the same progressively totalized count position even though repeated up and down counting occurs. For that reason, 7-Bar display 92 always reads the proper totalized time. In addition, the outputs of counter 20 occur at the desired condition and are not offset by a single pulse which may occur in prior arrangements using the 5/6 operating mode.

Referring now to FIG. 7, the first and second lines indicate up counting then down counting. The third line represents the prior art methods wherein the sixth pulse is inhibited both in the up and down direction. FIG. 7 shows an example of how a single pulse error can occur in these prior circuits. Assume that the up counting has occurred for twelve pulses. In the prior method, display 92 would exhibit the number 10 after twelve pulses. This is proper. However, upon the first down pulse, display 92 would be down counted to the number 9. This is inaccurate. The counter should still read the number 10 to track the up counting sequence. As the down counting continues, after five down pulses the next pulse is inhibited to remain at five. Thereafter, five more pulses cause the display to show zero. This produces a zero output. However, only eleven down pulses have been required to return to zero. Going in the up counting direction, twelve were required. Thus, down counting produces a zero one pulse in advance. In a 120 pps system, this produces an error of 8.33 ms. In the present invention, as illustrated in the bottom line of FIG. 7, staging occurs in the manner indicated in the upper two lines of FIG. 7. After twelve pulses, display 92 reads 10. Also, ring counter 200 is staged to C1. Thus, on the next down pulse, ring counter 20 causes gate 362 to skip. This retains the number 10 in display 92. Thereafter, the down counting operation completely and exactly follows or tracks the up counting operation. The inhibited pulse occurs at the same progressive totalized down position or positions. Thus, in the bottom line of FIG. 7, the first down pulse is inhibited. In the prior art, five down counting pulses are required before the inhibited circuit again inhibits a pulse. FIG. 7 shows the operation, as schematically illustrated in FIG. 6, and sets forth the tracking characteristics of the present invention. If repeated shifting between up and down counting occurs, ring counter 200 still causes the inhibited pulse or pulses to occur at the same progressively totalized count position or positions. In the preferred embodiment, this position is the sixth position with reference to the up counting mode and each six positions thereafter.

Referring now to FIG. 4A, a slight modification of the passage means 340, 342 is illustrated. In FIG. 4A, passage means 340a, 342a are controlled only by the logic on lines 312, 350 and lines 322, 360, respectively. Counter 20a has an up terminal and a down terminal so that pulses received in line 370 causes up counting and pulses received in line 372 causes down counting. This is somewhat different from counter 20 which is steered by lines 22, 24 taken together with the pulses on a common counting line 86. Other systems for up and down counting could be devised without departing from the intended spirit and scope of this invention.

Referring now to FIG. 4B, an AND gate 380 has inputs 248, 258. The NOR gate 382 has inputs 86 and line 384. Consequently, if both switches 246, 256 are closed, a logic 1 appears in line 384. This produces a logic 0 in line 386 to inhibit counter 20. As long as both input circuits 240, 250 are active, counter 20 holds the same count, which is proper in a totalizing operation. Concurrent up and down counting or timing produces a net zero charge in the totalized time. At the same time an OR gate 390 controlled by line 384 holds clocking line 224 at logic 1 to hold the staged position of ring counter 200. When either of switches 246, 256 is opened, circuit B continues operation as previously described.

Having thus defined the invention, it is claimed:

1. In a digital system for totalizing time including a digital counter having a first input means for counting up upon receipt of a counting pulse and a second input means for counting down upon receipt of a counting pulse; an up count control means for creating a train of up counting pulses having a constant time base frequency of 120 pps; a down count control means for creating a train of down counting pulses having said time base frequency; first pulse passage means for passing five out of six of said up counting pulses to said first input means of said digital counter and for inhibiting one out of six pulses; second pulse passage means for passing five out of six of said down counting pulses to said second input means of said digital counter and for inhibiting one out of six pulses; and, means for preventing concurrent up and down counting of said digital counter; the improvement comprising: sequence control means for causing said first and second passage means to inhibit said one out of six pulses at identical progressively totalized count positions, said sequence control means including cycle means for repeatedly cycling through a series of six numbers, said cycling means being indexed from number-to-number by each of said counting pulses, means for causing said numerical cycling to be in a first numerical direction upon creating of each of said up counting pulses, means for causing said cycling to be in a second numerical direction opposite to said first numerical direction upon creating of each of said down counting pulses, means for inhibiting the up counting pulse immediately after a selected cycled number has been reached in said first numerical direction and means for inhibiting the down counting pulses immediately before said selected cycle number has been reached in said second numerical direction; and, means for converting sixty cycle per second line current to said train of up counting pulses and means for converting sixty cycle per second line current to said train of down pulses.

* * * * *